(12) United States Patent
Chang et al.

(10) Patent No.: US 8,479,805 B2
(45) Date of Patent: Jul. 9, 2013

(54) HEAT-DISSIPATING ASSEMBLY

(75) Inventors: Shyy-Woei Chang, Sinjhuang (TW); Kuei-Feng Chiang, Sinjhuang (TW)

(73) Assignee: Asia Vital Components Co., Ltd., Sinjhuang, Taipei County ( * ) Notice: Subject to any disclaimer, the term of this patent is extended or adjusted under 35 U.S.C. 154(b) by 328 days.

(21) Appl. No.: 12/873,270

(22) Filed: Aug. 31, 2010

(65) Prior Publication Data
US 2012/0018137 A1    Jan. 26, 2012

(30) Foreign Application Priority Data

Jul. 21, 2010  (TW) .............................. 099123950 A

(51) Int. Cl.
*F28F 7/02*  (2006.01)

(52) U.S. Cl.
USPC .................................... 165/80.3; 165/104.21

(58) Field of Classification Search
USPC .. 165/80.3, 104.21, 104.26, 104.33; 361/700, 361/709
See application file for complete search history.

(56) References Cited

U.S. PATENT DOCUMENTS

| 4,550,774 | A | * | 11/1985 | Andres et al. ............ 165/104.21 |
| 5,937,936 | A | * | 8/1999 | Furukawa et al. ........ 165/104.33 |
| 6,158,502 | A | * | 12/2000 | Thomas .................... 165/104.26 |
| 6,234,242 | B1 | * | 5/2001 | Sehmbey et al. ............. 165/129 |
| 6,474,074 | B2 | * | 11/2002 | Ghoshal ........................... 62/3.7 |
| 6,483,705 | B2 | * | 11/2002 | Snyder et al. ................. 361/709 |
| 6,957,692 | B1 | * | 10/2005 | Win-Haw et al. ........ 165/104.33 |
| 2002/0179284 | A1 | * | 12/2002 | Joshi et al. ................... 165/80.3 |
| 2008/0128116 | A1 | * | 6/2008 | Dangelo et al. .......... 165/104.21 |

* cited by examiner

*Primary Examiner* — Teresa Walberg

(57) ABSTRACT

A heat-dissipating assembly includes a body and a bottom plate. The body has a heat-absorbing portion. The interior of the heat-absorbing portion is provided with a chamber covered by the bottom plate. The chamber has an evaporating region for generating a high pressure, and a condensing region for generating a low pressure. The pressure gradient between the evaporating region and the condensing region is used to drive the circulation of liquid/vapor phase of a working fluid. With this structure, heat can be conducted rapidly without providing any wick structure.

12 Claims, 17 Drawing Sheets

HEAT-DISSIPATING ASSEMBLY

This application claims the priority benefit of Taiwan patent application number 099123950 filed on Jul. 21, 2010.

BACKGROUND OF THE INVENTION

1. Field of the Invention

The present invention relates to a heat-dissipating assembly, and in particular to a heat-dissipating assembly which is capable of driving a working fluid to conduct the heat without providing a wick structure and the manufacture cost thereof is reduced greatly.

2. Description of Prior Art

Currently, since highly-advanced manufacturing processes have been developed in the electronic semiconductor industry, electronic apparatuses are made more and more compact in order to meet the request in the market. Although the dimension of the electronic apparatus is reduced, the power and performance thereof have been enhanced to a greater extent. For example, communication modules and household and/or industrial heat exchangers are provided therein with a number of electronic components. In operation, these electronic components generate a great amount of heat. Usually, a heat sink comprising heat-dissipating pieces and a fan is used to dissipate the heat of the electronic components and maintain the working temperature of the electronic components in a normal range.

Recently, liquid-cooling technology has been widely used in personal computers, but not used in the aforesaid communication modules and the house and/or industrial heat exchangers. According to the liquid-cooling technology, the bulky heat-dissipating pieces are eliminated to reduce the dimension of the heat sink, and a working liquid is used to absorb the heat of a heat source. In this way, the heat exchanger can be used to exchange the heat absorb by the working liquid with external air. Further, the length of pipes can be modified properly to change the position of the heat exchanger, so that the position of the heat exchanger may not be restricted by the space. Further, the liquid system needs a pump and a liquid tank to generate the circulation of the working fluid. Thus, the pump and pipelines may suffer damage to cause the leakage of the working fluid. Although the liquid-cooling system has the above-mentioned problems, they are still preferred options for the heat dissipation of electronic elements in a personal computer because the dimension and external space of the personal computer are larger.

However, the communication modules and the household and/or industrial heat exchangers are made more and more compact in size, so that the liquid-cooling system is not suitable in such a compact space. Preferably, heat pipes or other small-sized heat sinks are still used together with heat-dissipating fins to achieve a desired heat-dissipating effect in these small-sized communication modules and the household and/or industrial heat exchangers. In view of this, the manufacturers in this field continuously attempt to develop a better heat-dissipating assembly.

In prior art, heat-dissipating elements such as heat pipes, vapor chambers are used for thermal conduction. When manufacturing the heat pipe or the vapor chamber, the internal walls of the heat pipe or the vapor chamber are formed with a sintered body serving as a wick structure. To this end, metallic (such as copper) particles or powder are pressed and then sintered in a sintering furnace, so that the copper particles or powder can be sintered as a porous wick structure. The wick structure is configured to generate a capillary force so as to allow the working fluid to flow through. However, because of this sintered wick structure, the heat pipe or the vapor chamber has a certain thickness and thus unable to be made as compact as possible. Alternatively, sintered cores, grids or grooves may be formed inside the vapor chamber for generating a capillary force to drive the circulation of liquid/vapor phase of the working fluid therein. However, manufacturing the cores, grids and grooves in the vapor chamber involves a more complicated process and an increased cost.

Furthermore, in the above vapor chamber, the core is important because it serves as a path for allowing the condensed working fluid to flow through at high speed and maintains a sufficient capillary pressure to overcome the force of gravity.

Therefore, the conventional heat pipe or vapor chamber has the following problems.

(1) its manufacturing process is complex;
(2) it cannot be made compact enough;
(3) the cost is higher; and
(4) more working hours are needed.

SUMMARY OF THE INVENTION

In order to solve the above problems in prior art, an objective of the present invention is to provide a heat-dissipating assembly, which is applied to a communication module and a household and/or industrial heat exchanger without providing any wick structure, and it has a reduced cost and size.

Another objective of the present invention is to provide a heat-dissipating assembly, which has a high heat-conducting efficiency.

In order to achieve the above objectives, the present invention provides a heat-dissipating assembly, which comprises: a body and a bottom plate. The body has a heat-absorbing portion and a heat-dissipating portion. The heat-dissipating portion has a plurality of heat-dissipating fins. The interior of the heat-absorbing portion has a chamber. The chamber has a plurality of first guiding portions, a first communicating-hole set and a second communicating set. The first guiding portions are constituted of a plurality of guiding bodies arranged at intervals. One first flowing path is formed between adjacent two first guiding bodies. One end of the first flowing path is a free end connected to a free region. The first guiding portions and the first flowing paths collectively define an evaporating region. The interior of the first heat-dissipating fins forms a second flowing path. The second flowing path and the heat-dissipating fins collectively define a condensing region. The first communicating hole set and the second communicating hole set are in communication with the evaporating region and the condensing region. The bottom plate covers the chamber.

According to the heat-dissipating assembly of the present invention, each of the first flowing paths is formed between adjacent two first guiding bodies. The working liquid contacting a heat source is vaporized to become vapors, thereby generating a high pressure for driving the circulation of the liquid/vapor phase of the working fluid. The condensing region is properly designed to have a low pressure. Thus, a pressure gradient is generated between the high-pressure evaporating region and the low-pressure condensing region for driving the circulation of the liquid/vapor phase of the working fluid. By this arrangement, it is unnecessary to provide any wick structure to drive the circulation of the working fluid for conducting the heat, so that the heat-conducting efficiency and the manufacturing cost can be reduced.

DETAILED DESCRIPTION OF THE INVENTION

The above-mentioned objectives, structural and functional features of the present invention will be described with reference to preferred embodiments thereof and the accompanying drawings.

Figure 1:
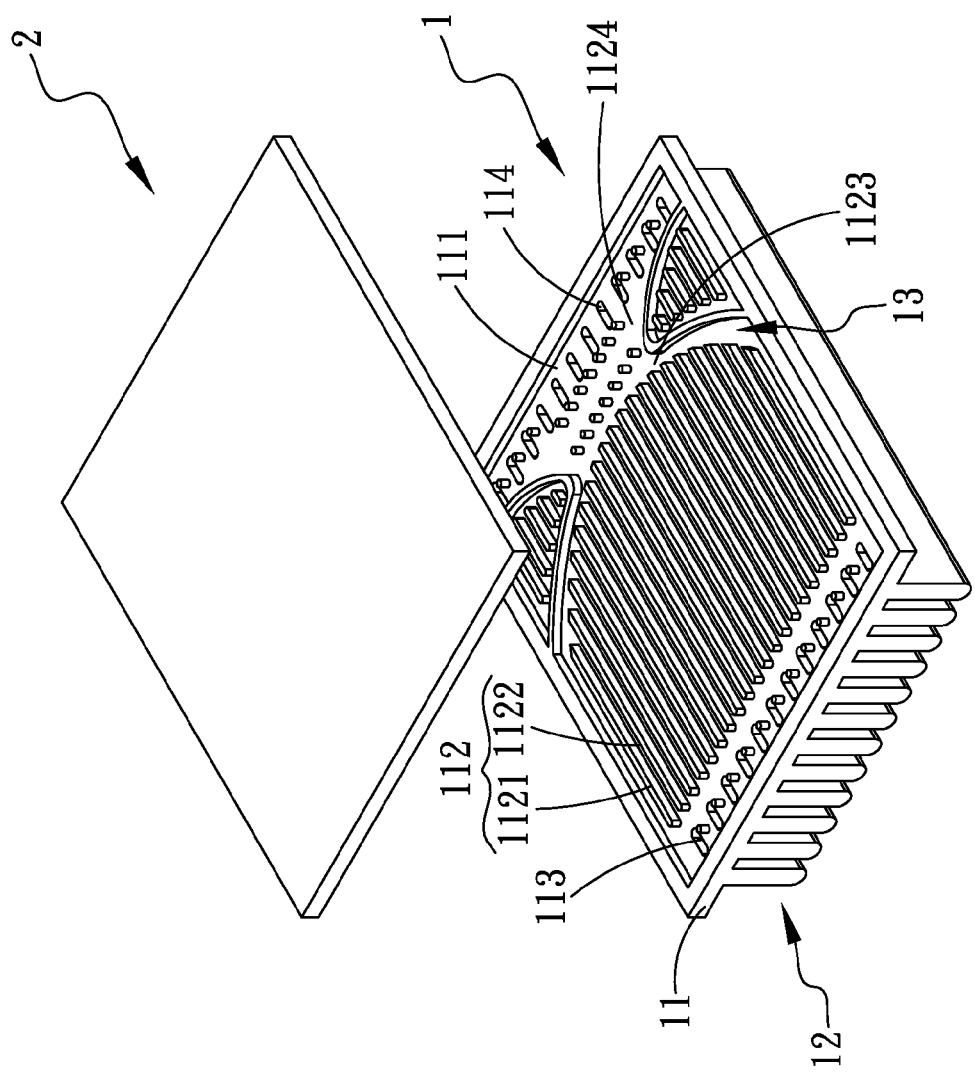
FIG. 1 is an exploded perspective view showing the heat-dissipating assembly according to the first embodiment of the present invention.
Figure 2:
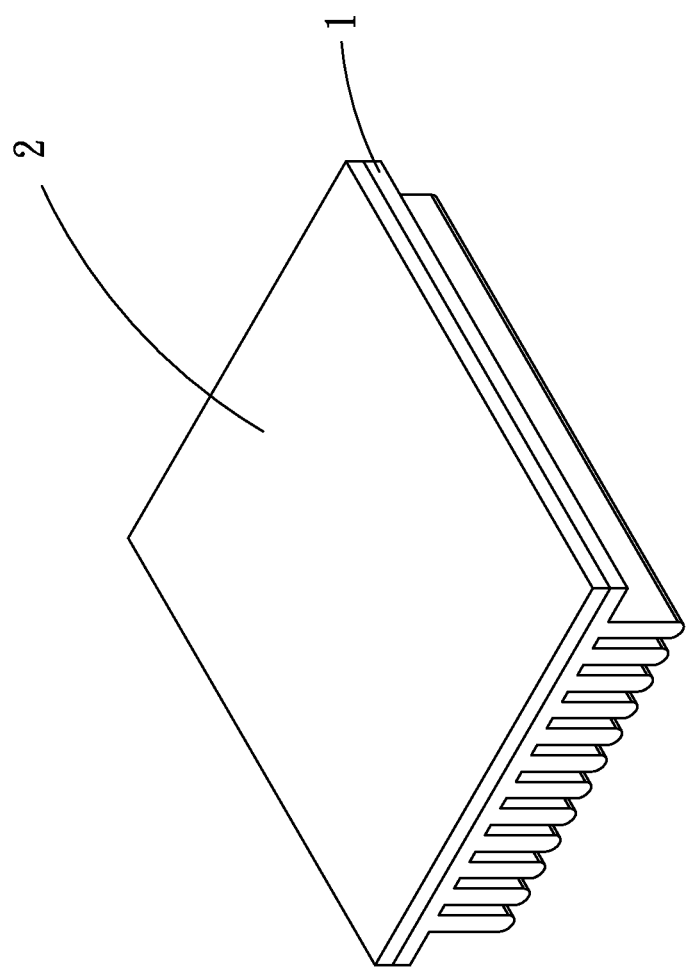
FIG. 2 is an assembled perspective view showing the heat-dissipating assembly according to the first embodiment of the present invention.
Figure 3:
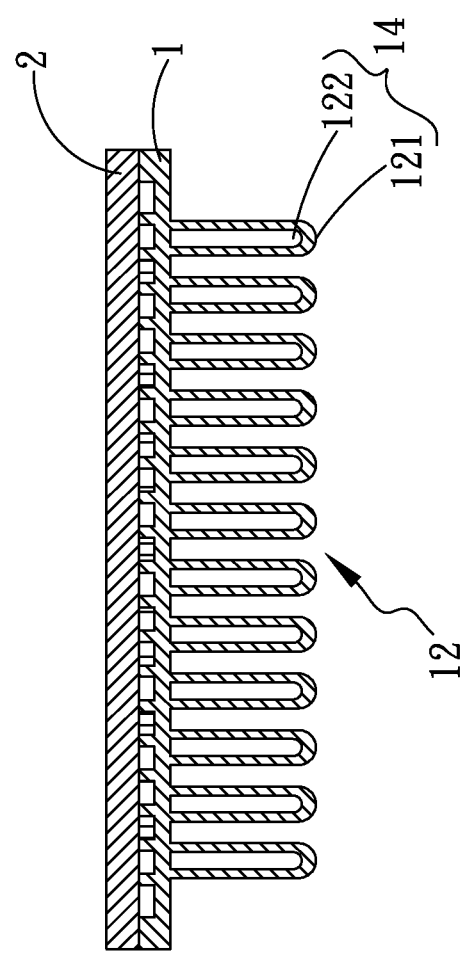
FIG. 3 is a cross-sectional view showing the heat-dissipating assembly according to the first embodiment of the present invention.

Please refer to FIGS. 1 to 3. As shown in these figures, the present invention provides a heat-dissipating assembly, which comprises a body 1 and a bottom plate 2.

The body 1 has a heat-absorbing portion 11 and a heat-dissipating portion 12. The interior of the heat-absorbing portion 11 has a chamber 111. The chamber 111 has a plurality of first guiding portions 112, a first communicating hole set 113, and a second communicating hole set 114. The first guiding portion 112 is constituted of a plurality of first guiding bodies arranged at intervals. One first flowing path 1122 is formed between adjacent two first guiding bodies 1121. One end of the first flowing path 1122 is a free end connected to a free region 1124. The first guiding portions 112 and the first flowing paths 1122 collectively define an evaporating region 13.

The bottom plate 2 correspondingly closed onto the chamber 111.

Each of the first guiding bodies 1121 may be an elongated rib. These elongated rib elongated ribs are arranged at intervals in a transverse direction. Each of the first flowing paths 1122 is formed between adjacent two elongated rib elongated ribs.

The heat-dissipating portion 12 has a plurality of heat-dissipating fins 121. The interior of each heat-dissipating fin 121 has a second flowing path 122. The second flowing path 122 and the heat-dissipating fin 121 collectively define a condensing region 14. The first communicating hole set 113 and the second communicating hole set 114 are in communication with the evaporating region 13 and the condensing region 14.

Figure 4:
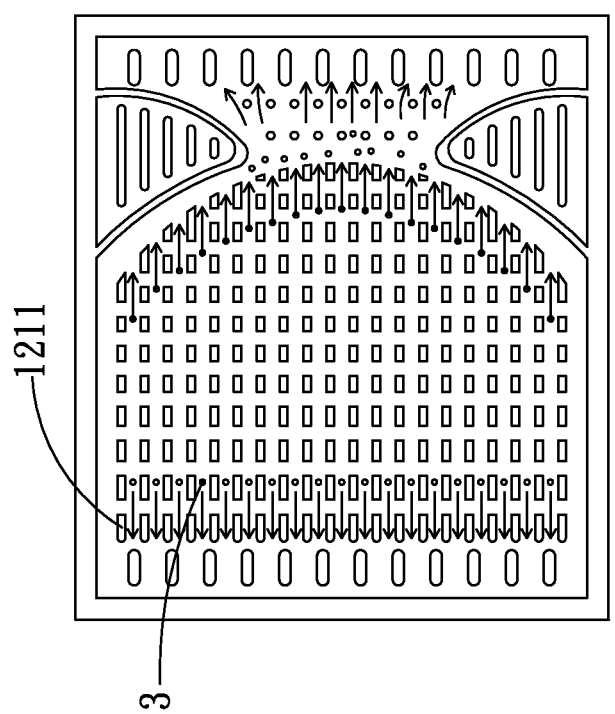
FIG. 4 is a bottom view showing the heat-dissipating assembly according to a second embodiment of the present invention.

Please refer to FIG. 4, which shows the heat-dissipating assembly according to the second embodiment of the present invention. As shown in this figure, some elements and the structural relationship between these elements in the second embodiment are substantially equal to those in the first embodiment, and thus the redundant description is omitted for simplicity. The difference between the second embodiment and the first embodiment lies in that the first guiding bodies 1121 are arranged at intervals in a longitudinal direction.

Figure 5A:
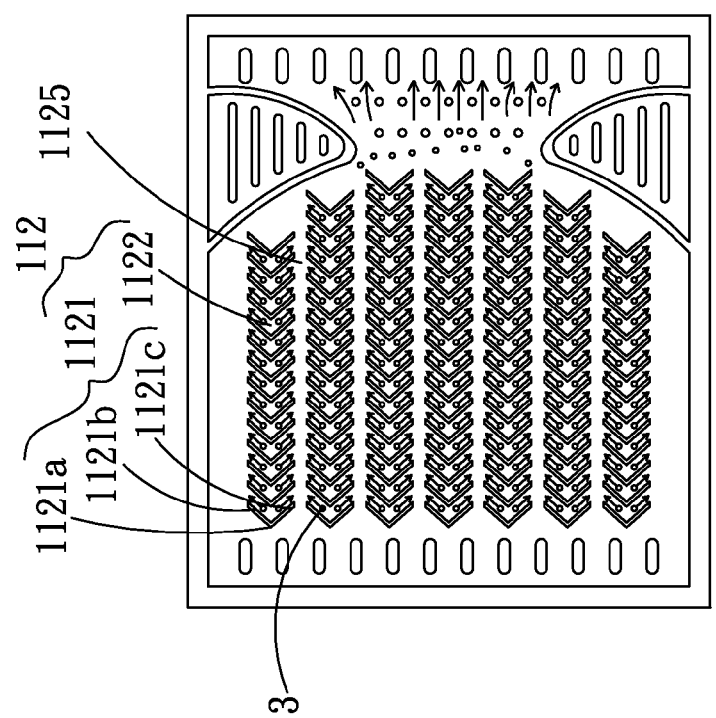
FIG. 5a is a bottom view showing the heat-dissipating assembly according to a third embodiment of the present invention.
Figure 5B:
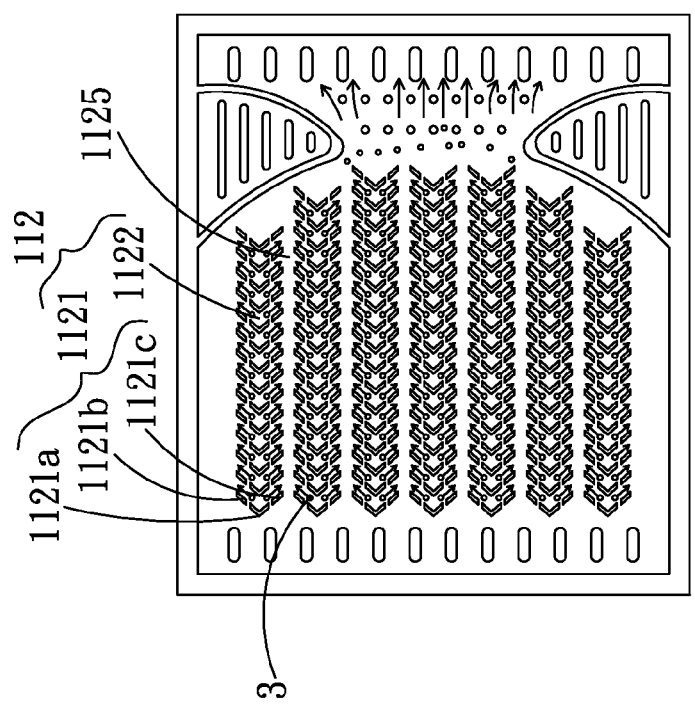
FIG. 5b is a bottom view showing the heat-dissipating assembly according to another version of the third embodiment of the present invention.
Figure 6A:
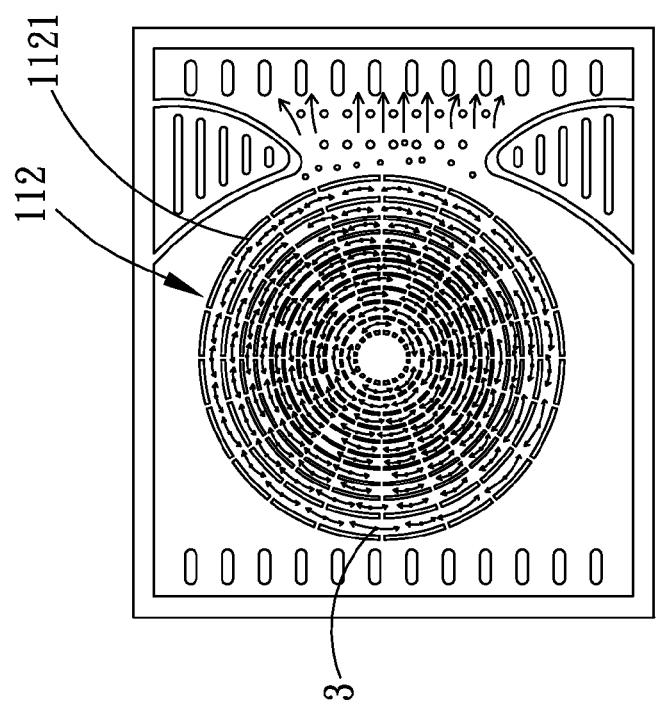
FIG. 6a is a bottom view showing the heat-dissipating assembly according to a fourth embodiment of the present invention.
Figure 6B:
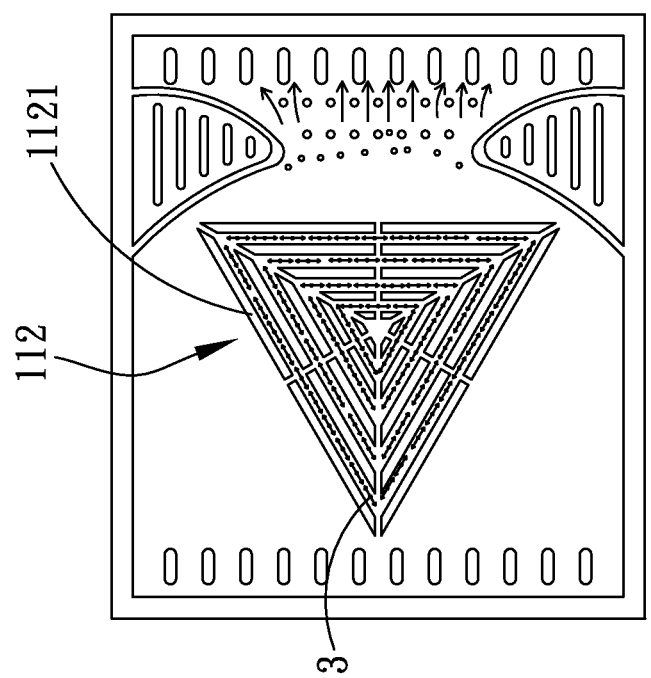
FIG. 6b is a bottom view showing the heat-dissipating assembly according to another version of the fourth embodiment of the present invention.
Figure 6C:
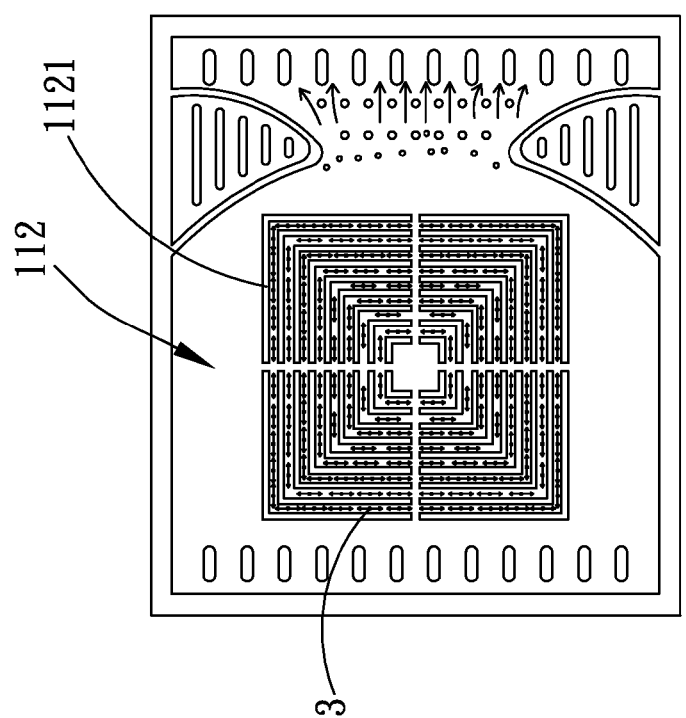
FIG. 6c is a bottom view showing the heat-dissipating assembly according to a further version of the fourth embodiment of the present invention.
Figure 6D:
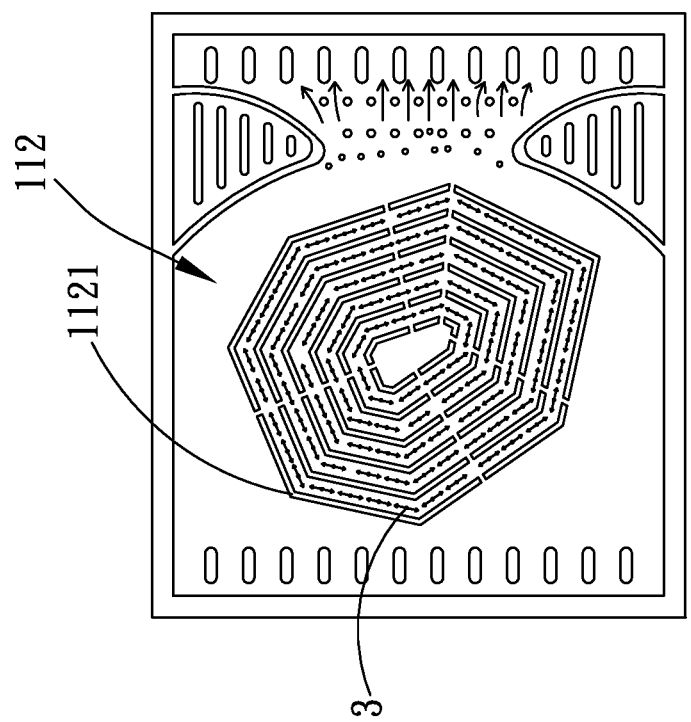
FIG. 6d is a bottom view showing the heat-dissipating assembly according to a still further version of the fourth embodiment of the present invention.

Please refer to FIGS. 5a and 5b, which show the heat-dissipating assembly according to the third embodiment of the present invention. As shown in this figure, some elements and the structural relationship between these elements in the third embodiment are substantially equal to those in the previous embodiments, and thus the redundant description is omitted for simplicity. The difference between the third embodiment and the previous embodiments lies in that the first guiding body 1121 is a rib. Each of the ribs has a first corner 1121a, a first edge 1121b and a second edge 1121c. The first edge 1121b and the second edge 1121c intersect with each other at the first corner 1121a. Each of the first flowing paths 1121 is formed between adjacent two ribs. A first pitch 1125 is formed between adjacent two rows of the first guiding portions 112.

The first edges 1121b may be arranged discontinuously and the second edges 1121c may be arranged discontinuously (as shown in FIG. 5b).

Please refer to FIGS. 6a, 6b, 6c and 6d, which show the heat-dissipating assembly according to the fourth embodiment of the present invention. As shown in this figure, some elements and the structural relationship between these elements in the fourth embodiment are substantially equal to those in the previous embodiments, and thus the redundant description is omitted for simplicity. The difference between the fourth embodiment and the previous embodiments lies in that each of the first guiding bodies 1121 of the first guiding portions 112 is a rib, and these ribs surround to form a plurality of concentric circles shown in FIG. 6a, concentric triangles shown in FIG. 6b, concentric rectangles shown in FIG. 6c, or concentric irregular shapes.

Figure 7A:
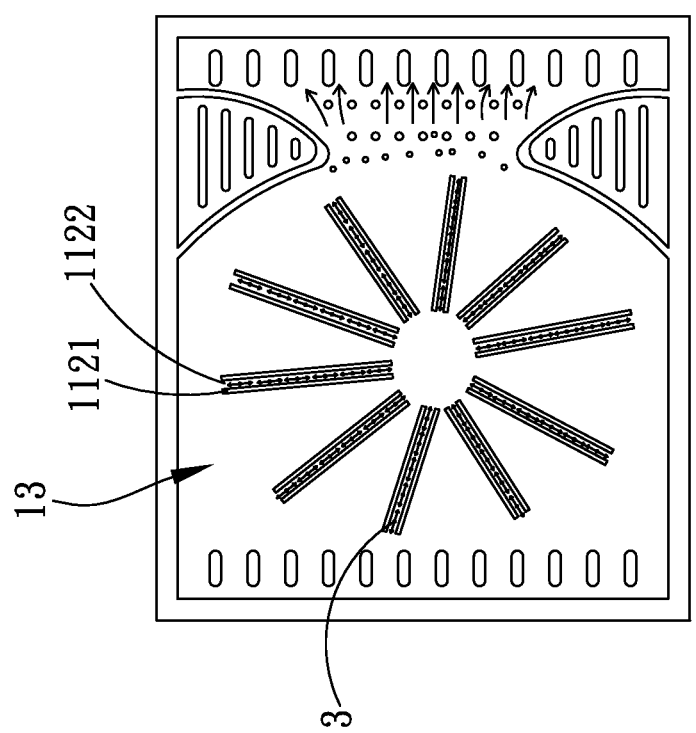
FIG. 7a is a bottom view showing the heat-dissipating assembly according to a fifth embodiment of the present invention.
Figure 7B:
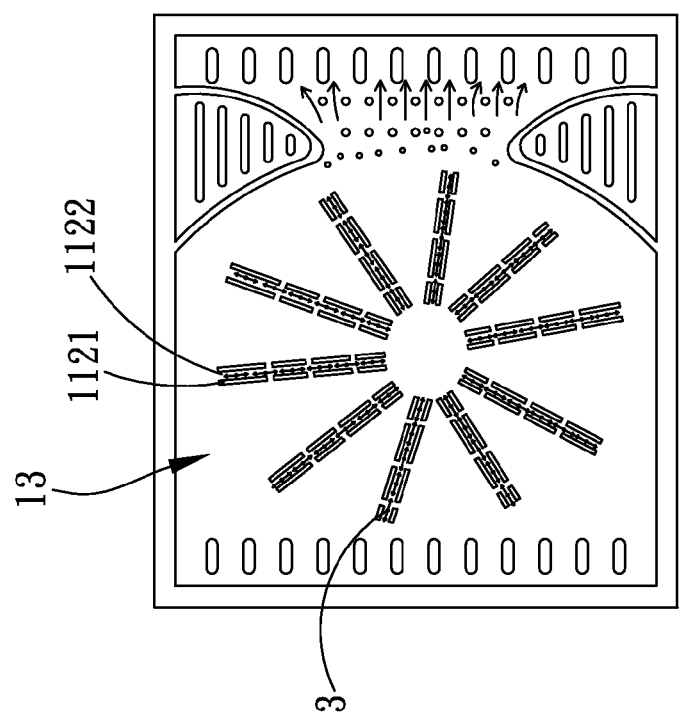
FIG. 7b is a bottom view showing the heat-dissipating assembly according to another version of the fifth embodiment of the present invention.

Please refer to FIGS. 7a and 7b, which show the heat-dissipating assembly according to the fifth embodiment of the present invention. As shown in this figure, some elements and the structural relationship between these elements in the fifth embodiment are substantially equal to those in the previous embodiments, and thus the redundant description is omitted for simplicity. The difference between the fifth embodiment and the previous embodiments lies in that the first guiding body 1121 is an elongated rib. These elongated rib elongated ribs are arranged at intervals and extend outwards and radially from the evaporating region 13. The first flowing path 1122 is formed between the adjacent two first guiding bodies 1121.

As shown in FIG. 7b, the first guiding bodies 1121 are discontinuously arranged in a longitudinal direction.

Figure 8:
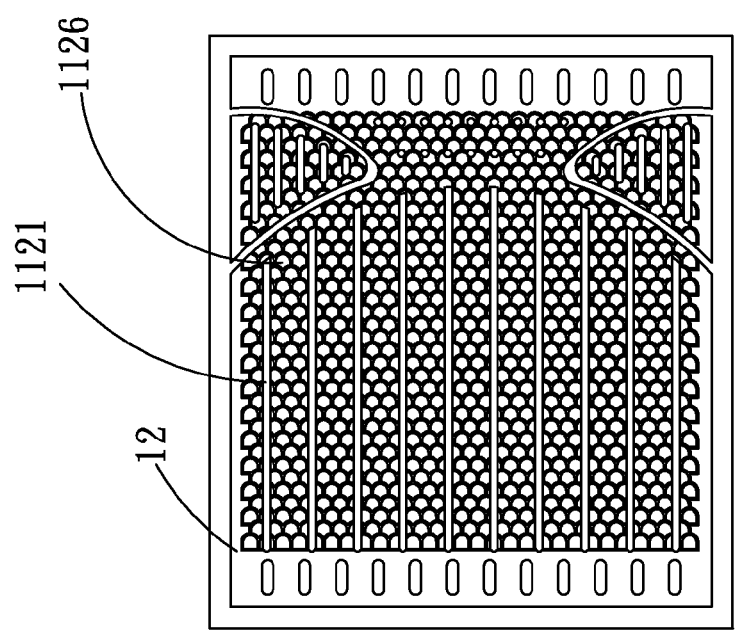
FIG. 8 is a bottom view showing the heat-dissipating assembly according to a sixth embodiment of the present invention.

Please refer to FIG. 8, which shows the heat-dissipating assembly according to the sixth embodiment of the present invention. As shown in this figure, some elements and the structural relationship between these elements in the sixth embodiment are substantially equal to those in the previous embodiments, and thus the redundant description is omitted for simplicity. The difference between the sixth embodiment and the previous embodiments lies in that a plurality pits 1126 is formed between the first guiding bodies 1121. Each of the pits 1126 is formed into one shape selected from a group consisted of circles, squares, triangles, fish scales and other geometries. In the present embodiment, the pits 1126 are formed into a fish-scale shape, but are not limited thereto.

Please refer to FIGS. 9a, 9b, 9c and 9d, which show the heat-dissipating assembly according to the seventh embodiment of the present invention. As shown in this figure, some elements and the structural relationship between these elements in the seventh embodiment are substantially equal to those in the previous embodiments, and thus the redundant description is omitted for simplicity. The difference between the seventh embodiment and the previous embodiments lies in that each of the first guiding portions 1121 of the first guiding portions 112 is a protrusion. These protrusions are arranged at intervals in the transverse direction and the longitudinal direction. Each of the first flowing paths 1122 is formed between the adjacent two protrusions.

Figure 9A:
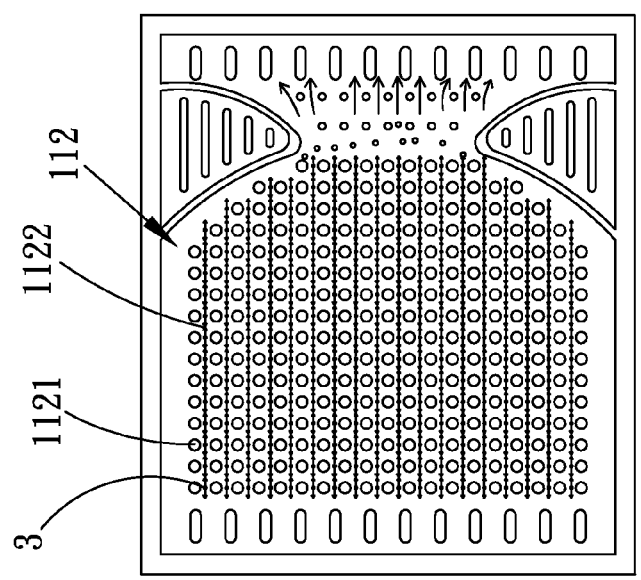
FIG. 9a is a bottom view showing the heat-dissipating assembly according to a seventh embodiment of the present invention.
Figure 9B:
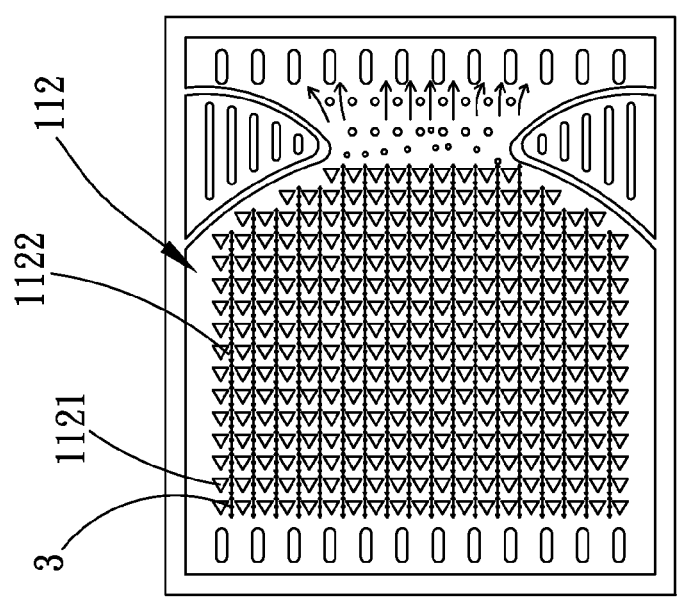
FIG. 9b is a bottom view showing the heat-dissipating assembly according to another version of the seventh embodiment of the present invention.
Figure 9C:
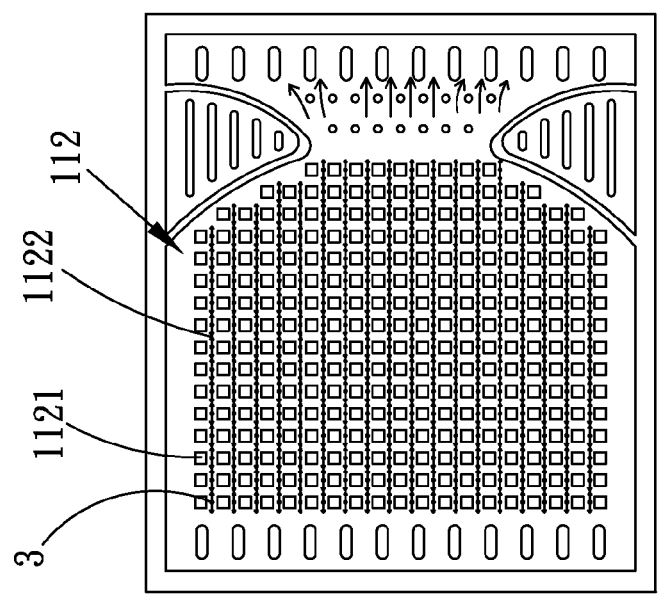
FIG. 9c is a bottom view showing the heat-dissipating assembly according to a further version of the seventh embodiment of the present invention.
Figure 9D:
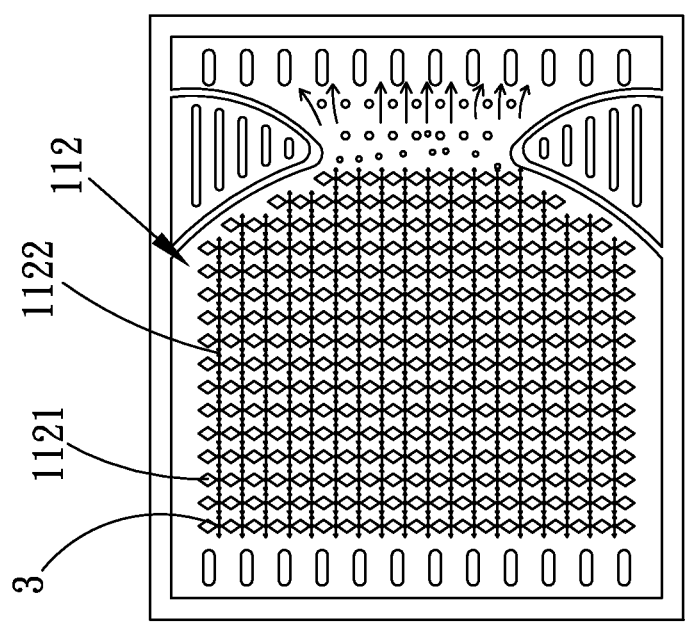
FIG. 9d is a bottom view showing the heat-dissipating assembly according to a still further version of the seventh embodiment of the present invention.

The protrusion is formed into a shape selected from a group consisted in circles as shown in FIG. 9a, triangles as shown in FIG. 9b, rectangles as shown in FIG. 9c, and rhombuses as shown in FIG. 9d.

Please refer to FIGS. 1 to 9d again. The first to seventh embodiments of the present invention provides an improved cooling technology by using the heat-dissipating assembly of the present invention and the circulation of liquid/vapor phases of a working fluid. The circulation of the working fluid is automatically driven by means of the pressure gradient, and the working fluid may be pure water, methyl alcohol, acetone, R134A and other suitable coolants. The chamber 111 of the heat-dissipating assembly is made vacuum, and the working fluid is filled in the chamber 111. The saturated temperature of the working fluid is in a range of 20 to 30° C. After vapor bubbles 2 are formed and collected in the evaporating region 12, these vapor bubbles 2 flow through the free region 1124 to release their pressure, thereby generating the pressure gradient for driving the circulation of liquid/vapor phase of the working fluid. Further, in the condensing region 14, the specific volume of the condensed working fluid increases abruptly to generate a negative pressure, thereby facilitating the circulation of liquid/vapor phase of the working fluid.

The condensed working fluid in the condensing region 14 is driven by the pressure gradient to flow back to the evaporating region 13. By means of a high coefficient of heat convection, the temperature gradient throughout the heat-dissipating assembly becomes more uniform and the thermal resistance is reduced.

That is, the heat generated by heat-generating elements (not shown) is conducted into the evaporating region 13 of the body 1, and then into the first flowing paths 1122 of the evaporating region 13. A portion of the working fluid is vaporized to form vapor bubbles in the first flowing paths 1122. The buoyance of the vapor bubbles makes them flow into the condensing region 14 to release their latent heat. The condensed working fluid flows back to the evaporating region 13 by means of a downward force of gravity. As a result, the condensing working fluid absorbs heat again in the evaporating region 13 whose surface is brought into thermal contact with the heat-generating elements (not shown).

Although many manufacturers in this field propose various kinds of liquid-cooling technologies, especially an active liquid-cooling technology in which the circulation of the working fluid is driven by a pump, such an active liquid-cooling technology has problems that the pump and associated valves may breakdown to affect the lifetime of the whole liquid-cooling system. In comparison with prior art, the present invention has the following advantageous features. The heat-dissipating assembly of the present invention utilizes the pressure gradient to automatically drive the circulation of liquid/vapor phase of the working fluid, so that no pump and wick structure are used in the present invention. Thus, the breakdown of the pump and the manufacturing process of the wick structure are eliminated, thereby saving energy and avoid noises generated by the operation of the pump.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A heat-dissipating assembly, comprising:
a body having a heat-absorbing portion and a heat-dissipating portion, the heat-dissipating portion having a plurality of heat-dissipating fins, the interior of the heat-absorbing portion having a chamber, the chamber having a plurality of first guiding portions, a first communicating hole set and a second communicating hole set spaced from said first communicating hole set, the first communicating hole set and the second communicating hole set being positioned toward opposite ends of said chamber, the first guiding portions being disposed between said first communicating hole set and said second communicating hole set and constituted of a plurality of first guiding bodies arranged at intervals, at least one first flowing path being formed between adjacent two first guiding bodies, at least one end of the first flowing path being a free end connected to a free region, the first guiding portions and the first flowing paths collectively define an evaporating region, the interior of the first heat-dissipating fins having a second flowing path, the second flowing path and the heat-dissipating fins collectively define a condensing region, the first communicating hole set and the second communicating hole set being in communication with the evaporating region and the condensing region such that working fluid is circulated through the assembly; and
a bottom plate correspondingly closed onto the chamber.

2. The heat-dissipating assembly according to claim 1, wherein each of the first guiding bodies is an elongated rib, the ribs are arranged at intervals in a transverse direction, the first flowing path is formed between the adjacent two elongated ribs.

3. The heat-dissipating assembly according to claim 2, wherein the first guiding bodies are arranged at intervals in a longitudinal direction.

4. The heat-dissipating assembly according to claim 1, wherein each of the first guiding bodies is a rib having a first corner, a first edge and a second edge, the first edge and the second edge intersect with each other at the first corner, the first flowing paths are formed between the adjacent two ribs respectively, a first pitch is formed between adjacent two rows of the first guiding portions.

5. The heat-dissipating assembly according to claim 4, wherein the first edges are arranged discontinuously, and the second edges are arranged discontinuously.

6. The heat-dissipating assembly according to claim 1, wherein each of the first guiding bodies of the first guiding portions is a rib, and these ribs surround discontinuously to form a shape selected from any of concentric circles, concentric triangles, concentric rectangles, and concentric irregular shapes.

7. The heat-dissipating assembly according to claim 1, wherein each of the first guiding bodies is an elongated rib, the ribs are arranged at intervals and extend radially and outwards from the evaporating region, the first flowing path is formed between the adjacent two first guiding bodies.

8. The heat-dissipating assembly according to claim 7, wherein the first guiding bodies are discontinuously arranged at intervals in a longitudinal direction.

9. The heat-dissipating assembly according to claim 1, wherein a plurality of pits is formed between the first guiding bodies.

10. The heat-dissipating assembly according to claim 9, wherein each of the pits is formed into a shape selected from any of circle, square, triangle, and fish-scale shape.

11. The heat-dissipating assembly according to claim 1, wherein each of the first guiding bodies of the first guiding portions is protrusion, and these protrusions are arranged at intervals in both a transverse direction and a longitudinal direction, each of the first flowing paths is formed between adjacent two protrusions.

12. The heat-dissipating assembly according to claim 11, wherein each of the protrusions is formed into a shape selected from any of a circle, triangle, rectangle, and rhombus.

* * * * *